(12) United States Patent
Morita et al.

(10) Patent No.: US 7,437,699 B2
(45) Date of Patent: Oct. 14, 2008

(54) LAYOUT METHOD FOR SEMICONDUCTOR INTEGRATED CIRCUIT, LAYOUT PROGRAM FOR SEMICONDUCTOR INTEGRATED CIRCUIT AND LAYOUT SYSTEM FOR SEMICONDUCTOR INTEGRATED CIRCUIT

(75) Inventors: Hirotaka Morita, Kasugai (JP); Shinji Fukasawa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 272 days.

(21) Appl. No.: 11/023,516

(22) Filed: Dec. 29, 2004

(65) Prior Publication Data

US 2006/0064663 A1  Mar. 23, 2006

(30) Foreign Application Priority Data

Sep. 17, 2004  (JP)  ............................. 2004-271674

(51) Int. Cl.
*G06F 17/50* (2006.01)
(52) U.S. Cl. .............................. 716/13; 716/12; 716/14
(58) Field of Classification Search ................. 716/8–15
See application file for complete search history.

(56) References Cited

U.S. PATENT DOCUMENTS 6,496,964 B2 * 12/2002 Inui et al. ...................... 716/8
6,993,740 B1 * 1/2006 Bergamaschi et al. ......... 716/12
7,117,459 B2 * 10/2006 Tanimoto et al. ............... 716/4
7,120,885 B2 * 10/2006 Nakayama et al. ............. 716/9

FOREIGN PATENT DOCUMENTS

JP   2002-015018   1/2002
JP   2003-345853   12/2003

* cited by examiner

*Primary Examiner*—Vuthe Siek
(74) *Attorney, Agent, or Firm*—Staas & Halsey LLP

(57) ABSTRACT

When carrying out placement and routing processing on a layout object circuit using circuit connectivity information and power supply information, a first step of specifying a power supply terminal corresponding to a signal terminal designated for input level fixation by the circuit connectivity information on the basis of terminal correspondence information, a second step of specifying a power supply voltage corresponding to the power supply terminal specified at the first step on the basis of the power supply information, and a third step of routing a power supply line of the power supply voltage specified at the second step to the signal terminal for input level fixation and thus connecting them, are carried out. Thus, connection processing to connect the signal terminal for input level fixation and the power supply line can be automatically carried out and a design period for a multi-power supply semiconductor integrated circuit can be reduced.

9 Claims, 10 Drawing Sheets

```
MODULE TOP;
    ⋮
  C1 I1 (.A1(1b'1),.A2(N1),.X1(N2),.X2(N3));
  C2 I2 (.A(N3),.X(N4));
    ⋮
ENDMODULE
```

Fig. 3(a)

```
VDDA 3.3 I1.VDD1,;
VDDB 1.8 I1.VDD2, I2.VDD;
VSS  0.0 I1.VSS, I2.VSS;
```

Fig. 3(b)

```
CELL C1
  GROUP
    POWER   VDD1;
    GROUND  VSS;
    SIGNAL  A1, X1;
  ENDGROUP
  GROUP
    POWER   VDD2;
    GROUND  VSS;
    SIGNAL  A2, X2;
  ENDGROUP
ENDCELL
CELL C2
  GROUP
    POWER   VDD;
    GROUND  VSS;
    SIGNAL  A, X;
  ENDGROUP
ENDCELL
```

Fig. 3(c)

```
MODULE TOP;
  ⋮
  C1 I1 (.A1(N0),.A2(N1),.X1(N2),.X2(N3));
  C2 I2 (.A(N3),.X(N4));
  ⋮
ENDMODULE
```

Fig. 6(a)

```
VDDA  3.3  I1.VDD1, I2.VDD;
VDDB  1.8  I1.VDD2;
VSS   0.0  I1.VSS,  I2.VSS;
```

Fig. 6(b)

```
LVC1  3.3  1.8;
LVC2  1.8  3.3;
```

Fig. 6(c)

```
CELL C1
  GROUP
    POWER   VDD1;
    GROUND  VSS;
    SIGNAL  A1, X1;
  ENDGROUP
  GROUP
    POWER   VDD2;
    GROUND  VSS;
    SIGNAL  A2, X2;
  ENDGROUP
ENDCELL
CELL C2
  GROUP
    POWER   VDD;
    GROUND  VSS;
    SIGNAL  A, X;
  ENDGROUP
ENDCELL
CELL LVC1
  GROUP
    POWER   VDD1;
    GROUND  VSS;
    SIGNAL  A;
  ENDGROUP
  GROUP
    POWER   VDD2;
    GROUND  VSS;
    SIGNAL  X;
  ENDGROUP
ENDCELL
CELL LVC2
  GROUP
    POWER   VDD1;
    GROUND  VSS;
    SIGNAL  A;
  ENDGROUP
  GROUP
    POWER   VDD2;
    GROUND  VSS;
    SIGNAL  X;
  ENDGROUP
ENDCELL
```

Fig. 8

```
MODULE TOP:
  ...
  C1   I1  (.A1(N0),..A2(N1),..X1(N2),..X2(N3));
  LVC2 I3  (.A(N3),..X(N31));
  C2   I2  (.A(N31),..X(N4));
  ...
ENDMODULE
```

Fig. 9

LAYOUT METHOD FOR SEMICONDUCTOR INTEGRATED CIRCUIT, LAYOUT PROGRAM FOR SEMICONDUCTOR INTEGRATED CIRCUIT AND LAYOUT SYSTEM FOR SEMICONDUCTOR INTEGRATED CIRCUIT

CROSS-REFERENCE TO RELATED APPLICATION

This application is based upon and claims the benefit of priority from Japanese Patent Application No. 2004-271674, filed Sep. 17, 2004, the entire contents of which are incorporated herein by reference.

BACKGROUND OF THE INVENTION

1. Field of the Invention

The present invention relates to a layout method, a layout program and a layout system for a semiconductor integrated circuit, and particularly to a layout method, a layout program and a layout system for a semiconductor integrated circuit driven by plural power supply voltages.

2. Description of the Related Art

In a conventional layout system for a semiconductor integrated circuit, layout processing (placement and routing processing) for a layout object circuit is performed using circuit connectivity information (net list) representing the connecting relation between circuit components in a multi-power supply layout object circuit and power supply information that associates a power supply voltage with a power supply terminal of a circuit component to be supplied with the power supply voltage. Specifically, in this layout system, signal terminals designated for interconnection by the net list are connected with each other and the power supply terminal and the power supply line of the power supply voltage associated with each other by the power supply information are connected with each other.

With respect to a layout design for a multi-power supply semiconductor integrated circuit, JP-A-2003-345853 discloses a verification method for a semiconductor integrated circuit that enables efficient detection of incorrect connection of circuit components in a layout object circuit without exceptions, and JP-A-2002-15018 discloses a design method for a semiconductor integrated circuit that enables easy designing of a layout for a multi-power supply semiconductor integrated circuit, in which, for example, the power supply lines for the multi-power supply can be automatically carried out.

In the conventional layout system for a semiconductor integrated circuit, since the corresponding relation between the signal terminal of the circuit component and the power supply voltage cannot be recognized from the net list and the power supply information, the power supply line to be connected to the signal terminal designated for input level fixation by the net list, or the position where a level-converting cell should be inserted and the type of the level-converting cell to be inserted cannot be automatically judged. Therefore, in the conventional layout system for a semiconductor integrated circuit, a person in charge of layout must manually carry out connection processing to connect the signal terminal for input level fixation and the power supply line, or insertion processing to insert the level-converting cell, while checking the circuit structure. As a result, incorrect connection due to the signal terminal for input level fixation or the level-converting cell tends to occur in layout verification such as LVS (Layout Verses Schematic) for verifying connection identity between the net list and layout data, and the number of repetitions of the layout processing and the layout verification increases. Thus, the design period for a semiconductor integrated circuit (layout design period) becomes longer. Moreover, JP-A-2003-345853 and JP-A-2002-15018 do not disclose any technique related to the connection processing to connect the signal terminal for input level fixation and the power supply line or the insertion processing to insert the level-converting cell.

SUMMARY OF THE INVENTION

It is an object of the present invention to automatically perform the connection processing to connect the signal terminal for input level fixation and the power supply line or the insertion processing to insert the level-converting cell, and to reduce the design period for the multi-power supply semiconductor integrated circuit.

According to one aspect of the present invention, the following processing is carried out, for example, by a computer for laying out a semiconductor integrated circuit driven by plural power supply voltages. When carrying out placement and routing processing for a layout object circuit using circuit connectivity information and power supply information, first, a power supply terminal corresponding to a signal terminal designated for input level fixation by the circuit connectivity information is specified on the basis of terminal correspondence information (first step). In this case, the circuit connectivity information represents connecting relation between circuit components in a layout object circuit. The power supply information represents corresponding relation between a power supply voltage and a power supply terminal. The terminal correspondence information represents, for each circuit component, corresponding relation between a signal terminal and a power supply terminal connected to a circuit that receives a signal from the signal terminal or a circuit that outputs a signal to the signal terminal within the circuit component. Next, a power supply voltage corresponding to the power supply terminal specified at the first step is specified on the basis of the power supply information (second step). Then, routing processing between a power supply line of the power supply voltage specified at the second step and the signal terminal for input level fixation is carried out, and they are connected with each other (third step).

In this manner, the signal terminal for input level fixation can be connected to the power line of the desired power supply voltage on the basis of automatic judgment without any manual operation. Therefore, no incorrect connection due to the signal terminal for input level fixation is detected in layout verification, and the number of repetitions of layout processing and layout verification can be reduced. It can thus contribute to reduction in design period for the semiconductor integrated circuit.

According to a second aspect of the present invention, the following processing is carried out, for example, by a computer for laying out a semiconductor integrated circuit driven by plural power supply voltages. First, power supply terminals corresponding to signal terminals designated for interconnection by circuit connectivity information, respectively, are specified on the basis of terminal correspondence information (first step). In this case, the terminal correspondence information represents, for each circuit component, correspondence between a signal terminal and a power supply terminal connected to an input circuit that receives a signal from the signal terminal or an output circuit that outputs a signal to the signal terminal. The circuit connectivity information represents connecting relation between circuit components in a layout object circuit.

Next, power supply voltages corresponding to the power supply terminals specified at the first step, respectively, are specified on the basis of power supply information (second step). In this case, the power supply information represents correspondence between power supply voltages and power supply terminals of the circuit components. Next, if the power supply voltages specified at the second step are different from each other, a circuit component for level conversion that should be inserted between the signal terminals is selected on the basis of the power supply voltages specified at the second step (third step). Then, the circuit component for level conversion selected at the third step is inserted to the circuit connectivity information, and circuit connectivity information used for placement and routing on the layout object circuit is generated (fourth step).

In this manner, a level-converting cell of a type that should be inserted can be inserted at a position where it should be inserted, on the basis of automatic judgment without any manual operation. Therefore, no incorrect connection due to the level-converting cell is detected in layout verification, and the number of repetitions of layout processing and layout verification can be reduced. It can thus contribute to reduction in design period for the semiconductor integrated circuit.

In a preferred embodiment of the first or second aspect of the present invention, the terminal correspondence information includes a group of information representing, for each circuit component, correspondence between signal terminals and power supply terminals connected to a circuit that receives a signal from the signal terminals or a circuit that outputs a signal to the signal terminals, respectively, within the circuit component. Therefore, the corresponding relation between the signal terminals and the power supply terminals in each circuit component can be easily recognized.

In a preferred embodiment of the first or second aspect of the present invention, the power supply information associates power supply voltage name, power supply voltage value, and a power supply terminal to be supplied with the power supply voltage. Therefore, the corresponding relation between the power supply voltage and the power supply terminal can be easily recognized.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIGS. 3(a) to 3(c) are explanatory views showing an example of net list, power supply information, and terminal group information of FIG. 2;

FIGS. 6(a) to 6(c) are explanatory views showing an example of net list, power supply information, and level-converting cell information of FIG. 5;

FIG. 8 is an explanatory view showing an example of the terminal group information of FIG. 5;

FIG. 9 is an explanatory view showing an example of a net list generated by inserting a level-converting cell into the net list of FIG. 6(a)

DESCRIPTION OF THE PREFERRED EMBODIMENTS

Figure 1:
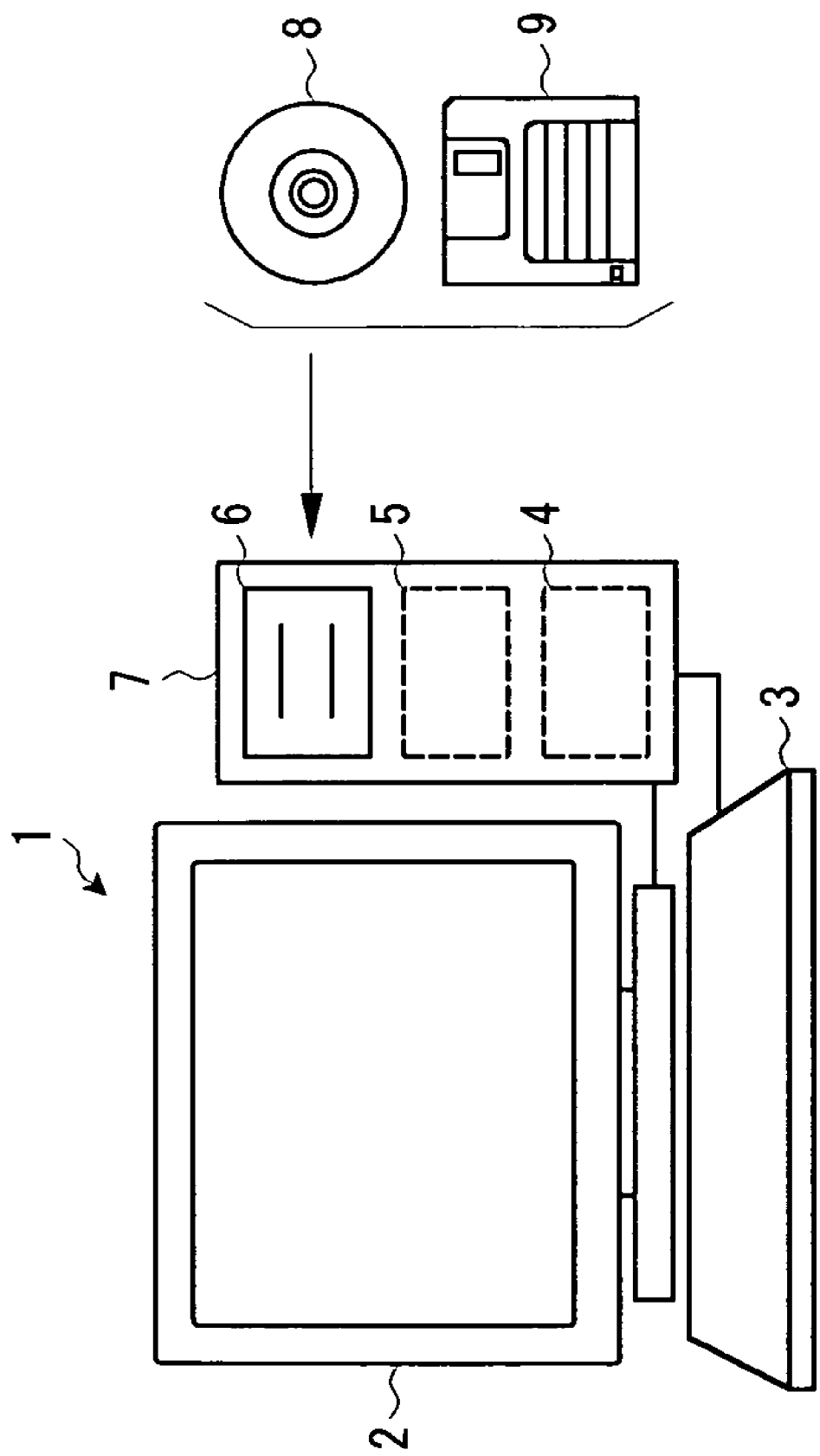
FIG. 1 is an explanatory view showing an exemplary system structure for realizing the present invention.

Hereinafter, embodiments of the present invention will be described with reference to the drawings. FIG. 1 shows an exemplary system structure for realizing the present invention. The system for realizing the present invention includes, for example, a calculator such as a workstation 1, and a recording medium such as a CD-ROM 8 or a flexible disk 9 on which the layout program for a semiconductor integrated circuit according to the present invention is recorded. The workstation 1 has a display 2 for performing screen display, a keyboard 3 for a user to input an instruction by pressing a key thereon, and a control device 7 in which a CPU 4 (control unit), a hard disk 5 (storage unit) and a recording medium drive unit 6 are built in. In the recording medium drive unit 6, the CD-ROM 8 or the flexible disk 9 can be loaded. After the CD-ROM 8 or the flexible disk 9 is loaded into the recording medium drive unit 6, the workstation 1 downloads the layout program recorded on the CD-ROM 8 or the flexible disk 9 to the hard disk 5 in response to an instruction inputted through the keyboard 3. As the CPU 4 executes the layout program stored on the hard disk 5, the workstation 1 carries out layout processing for a semiconductor integrated circuit. That is, the workstation 1 functions as a layout system for a semiconductor integrated circuit.

Figure 2:
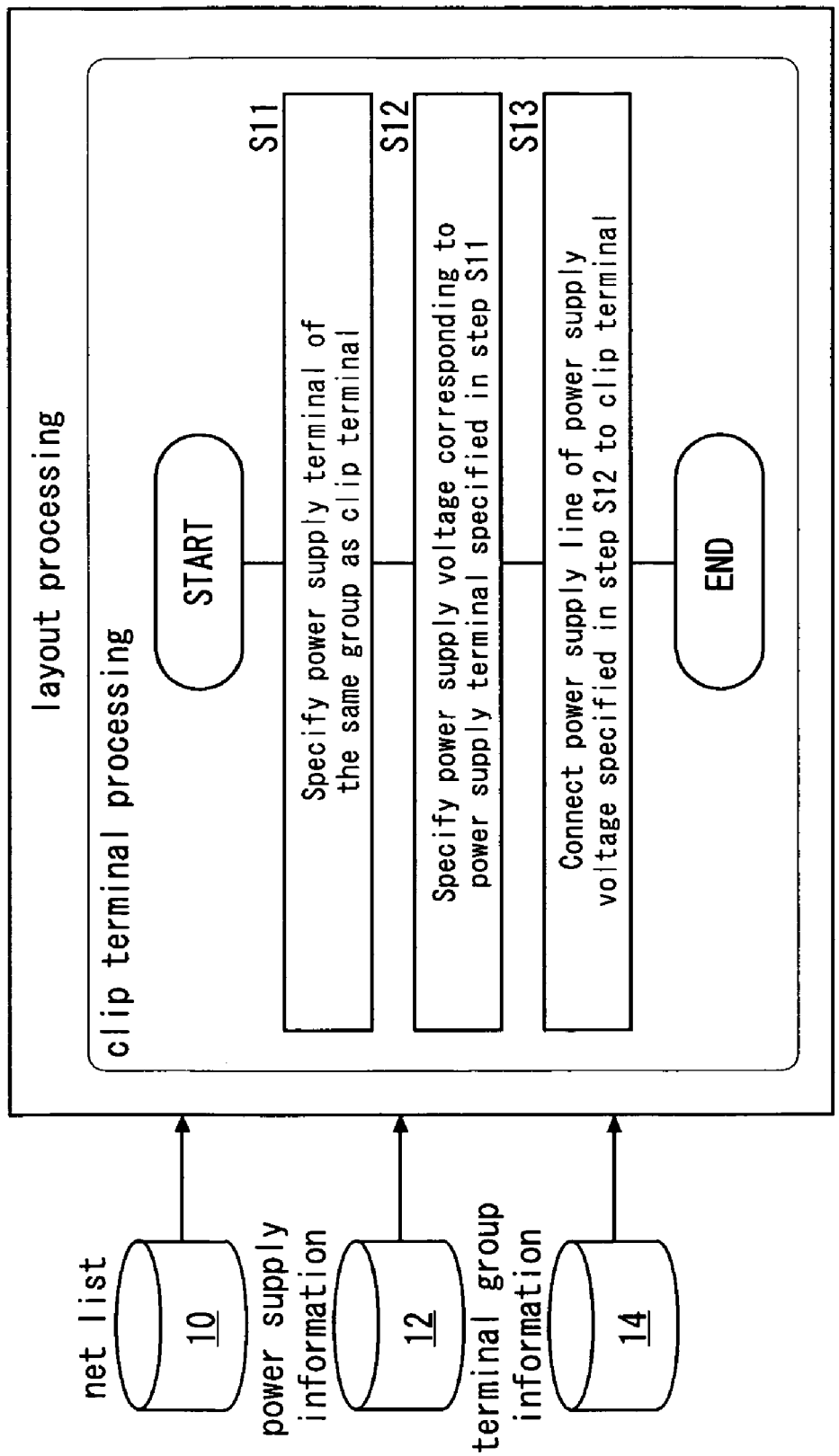
FIG. 2 is an explanatory view showing a first embodiment of the present invention.

FIG. 2 shows a first embodiment of the present invention. This layout method is carried out, for example, as the CPU 4 of the workstation 1 shown in FIG. 1 executes the layout program stored on the hard disk 5. The CPU 4 carried out layout processing for a layout object circuit driven by plural power supply voltages, referring to a net list 1 0 (circuit connectivity information), power supply information 12 and terminal group information 14 (terminal correspondence information) stored on the hard disk 5. In this case, the net list 10 represents the connecting relation between cells (circuit components) in the layout object circuit. The power supply information 12 represents the corresponding relation between power supply voltages and power supply terminals of the cells. The terminal group information 14 represents, for each cell, the corresponding relation between a signal terminal and a power supply terminal connected to a circuit that receives a signal from the signal terminal or a circuit that outputs a signal to the signal terminal within the cell. At the time of the layout processing for the layout object circuit, the CPU 4 sequentially carries out the following steps S11 to S13 (clip terminal processing), thereby connecting a signal terminal (clip terminal) designated for input level fixation by the net list 10 to a power supply line of a desired power supply voltage.

(Step S11 (first step)) The CPU 4 specifies a power supply terminal of the same group as the clip terminal, referring to the terminal group information 14. After that, the processing shifts to step S12.

(Step S12 (second step)) The CPU 4 specifies a power supply voltage corresponding to the power supply terminal specified at step S11, referring to the power supply information 12. After that, the processing shifts to step S13.

(Step S13 (third step)) The CPU 4 routes the power supply line of the power supply voltage specified at step S12 to the clip terminal and thus connects them. This completes connection processing to connect the clip terminal with the power supply line.

Figure 4:
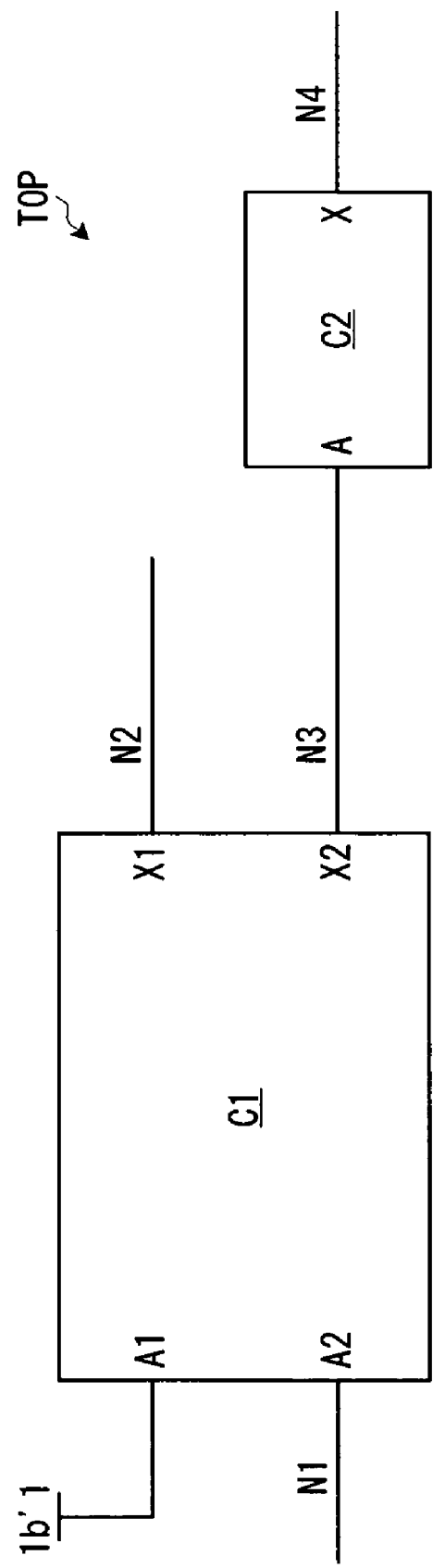
FIG. 4 is an explanatory view showing a layout object circuit corresponding to the net list of FIG. 3(a)

Now, the connection processing to connect the clip terminal with the power supply line (steps S11 to S13) will be described with reference to a specific example. FIGS. 3(a) to 3(c) show an example of the net list 10, the power supply information 12 and the terminal group information 14 of FIG. 2, respectively. FIG. 4 shows a layout object circuit corresponding to the net list 10 of FIG. 3(a). In FIG. 3(a) and FIG. 4, the layout object circuit TOP includes a two-input two-output cell C1 (instance name: I1) and a one-input one-output cell C2 (instance name: I2). In the net list 10 of FIG. 3(a), an input signal terminal A1 of the cell C1 (instance name: I1) is designated for fixation to high level. An input signal terminal A2 of the cell C1 (instance name: I1) is designated for connection to a net N1. Output signal terminals X1, X2 of the cell C1 (instance name: I1) are designated for connection to nets N2, N3, respectively. An input signal terminal A of the cell C2 (instance name: I2) is designated for connection to the net N3. That is, the signal terminal X2 of the cell C1 (instance name: I1) and the signal terminal A of the cell C2 (instance name: I2) are designated for interconnection. A signal terminal X of the cell C2 (instance name: I2) is designated for connection to a net N4.

In the power supply information 12 of FIG. 3(b), a high-potential power supply voltage VDDA (power supply voltage name: VDDA, power supply voltage value: 3.3 V) is designated for supply to a power supply terminal VDD1 of the cell C1 (instance name: I1). A high-potential power supply voltage VDDB (power supply voltage name: VDDB, power supply voltage value: 1.8 V) is designated for supply to a power supply terminal VDD2 of the cell C1 (instance name: I1) and a power supply terminal VDD of the cell C2 (instance name: I2). A low-potential power supply voltage VSS (power supply voltage name: VSS, power supply voltage value: 0 V) is designated for supply to a power supply terminal VSS of the cell C1 (instance name: I1) and a power supply terminal VSS of the cell C2 (instance name: I2).

In the terminal group information 14 of FIG. 3(c), the signal terminals A1, X1 and the power supply terminals VDD1, VSS of the cell C1 belong to the same group. This means that a circuit that receives a signal from the signal terminal A1 and a circuit that outputs a signal to the signal terminal X1 within the cell C1 are connected to the power supply terminals VDD1, VSS. The signal terminals A2, X2 and the power supply terminals VDD2, VSS of the cell C1 belong to the same group. This means that a circuit that receives a signal from the signal terminal A2 and a circuit that outputs a signal to the signal terminal X2 within the cell C1 are connected to the power supply terminals VDD2, VSS. The signal terminals A, X and the power supply terminals VDD, VSS of the cell C2 belong to the same group. This means that a circuit that receives a signal from the signal terminal A and a circuit that outputs a signal to the signal terminal X within the cell C2 are connected to the power supply terminals VDD, VSS.

In the layout processing for the layout object circuit TOP using the net list 10, the power supply information 12 and the terminal group information 14 as described above, in order to connect the signal terminal A1 (clip terminal) of the cell C1 (instance name: I1) to a power supply line of a desired power supply voltage, first, the power supply terminals VDD1, VSS belong to the same group as the signal terminal A1 of the cell C1 are specified on the basis of the terminal group information 14 (step S11 of FIG. 2). Next, since the signal terminal A1 of the cell C1 (instance name: I1) is designated for fixation to high level by the net list 10, the power supply voltage VDDA corresponding to the power supply terminal VDD1 of the cell C1 (instance name: I1) is specified on the basis of the power supply information 12 (step S12 of FIG. 2). Then, routing processing to route the power supply line of the power supply voltage VDDA to the signal terminal A1 of the cell C1 (instance name: I1) is carried out (step S13 of FIG. 2). In this manner, the signal terminal A1 of the cell C1 (instance name: I1) is automatically connected to the power supply line of the desired power supply voltage.

As described above, in the first embodiment, since the clip terminal can be connected to the power supply line of the desired power supply voltage on the basis of automatic judgment without any manual operation, no incorrect connection due to the clip terminal is detected in layout verification such as LVS. Therefore, the number of repetitions of the layout processing and the layout verification can be reduced and this can contribute to reduction in layout design period for the semiconductor integrated circuit.

Figure 5:
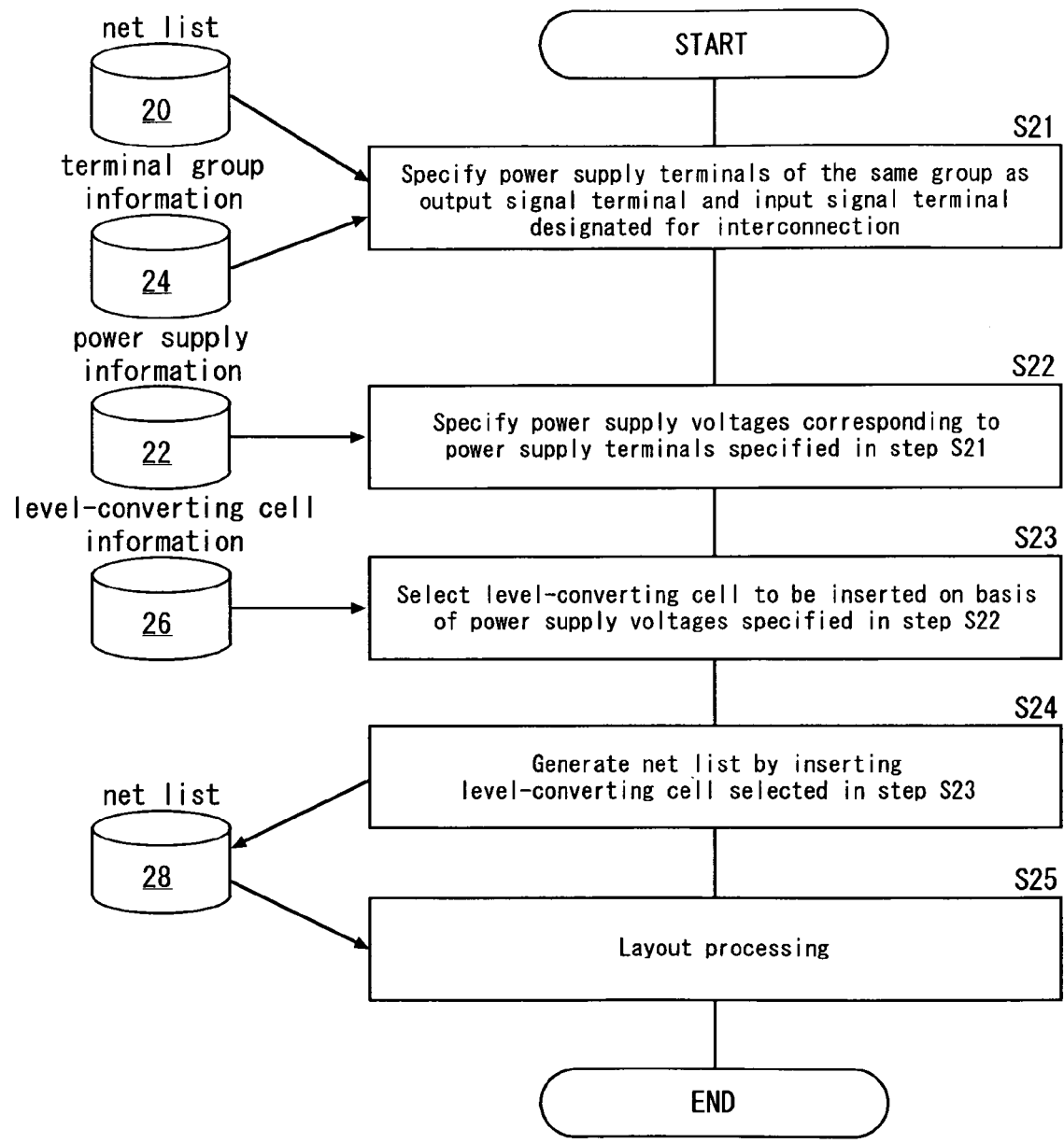
FIG. 5 is an explanatory view showing a second embodiment of the present invention.

FIG. 5 shows a second embodiment of the present invention. This layout method is carried out, for example, as the CPU 4 of the workstation 1 shown in FIG. 1 executes a layout program stored on the hard disk 5, as in the first embodiment. The layout program executed by the CPU 4 in this embodiment is different from the layout program in the first embodiment. The CPU 4 sequentially carries out the following steps S21 to S25, thereby carrying out layout processing for a layout object circuit driven by plural power supply voltages.

(Step S21 (first step)) The CPU 4 specifies power supply terminals of the same group as an output signal terminal and an input signal terminal designated for interconnection, respectively, referring to a net list 20 and terminal group information 24. After that, the processing shifts to step S22.

(Step S22 (second step)) The CPU specifies power supply voltages corresponding to the power supply terminals designated at step S21, respectively, referring to power supply information 22. After that, the processing shifts to step S23.

(Step S23 (third step)) The CPU 4 selects a level-converting cell to be inserted between the output signal terminal and the input signal terminal having different power supply voltages from each other specified at step S22, on the basis of the power supply voltages specified at step S22, for example, referring to level-converting cell information 26 representing a level-converting function of a level-converting cell. Specifically, the CPU 4 selects a level-converting cell that converts a signal setting the power supply voltage corresponding to the output signal terminal specified at step S22 to high level to a signal setting the power supply voltage corresponding to the input signal terminal specified at step S22 to high level, referring to the level-converting cell information 26. After that, the processing shifts to step S24.

(Step S24 (fourth step)) The CPU 4 inserts the level-converting cell selected at step S23 into the net list 20 and thus generates a net list 28. This completes insertion processing to inset the level-converting cell.

(Step S25) The CPU 4 caries out layout processing for the layout object circuit, using the net list 28 generated at step S24 and the power supply information 22.

Figure 7:
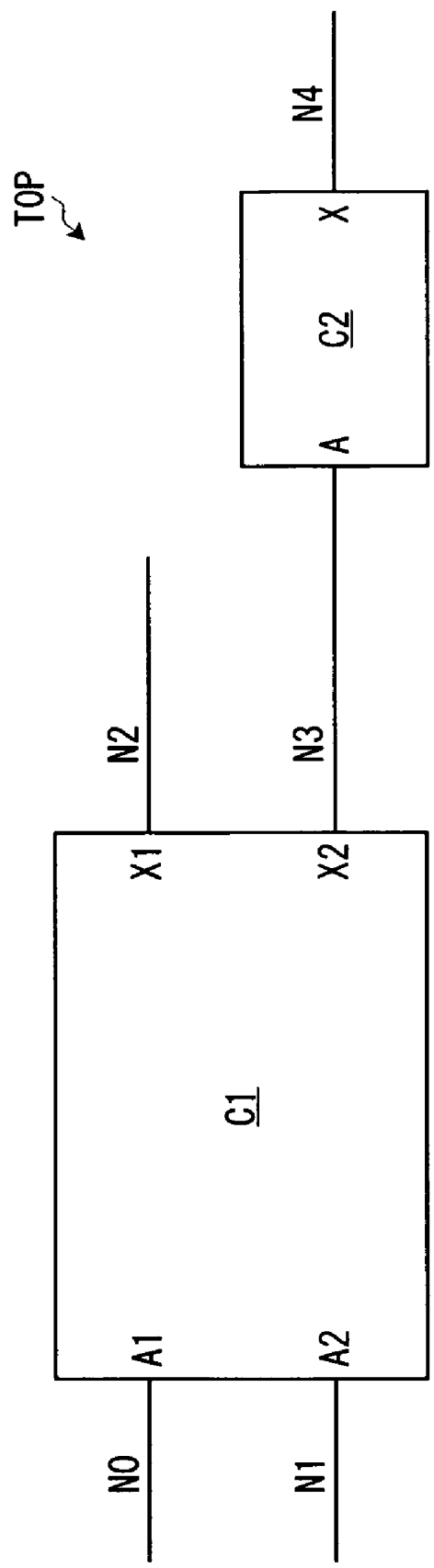
FIG. 7 is an explanatory view showing a layout object circuit corresponding to the net list of FIG. 6(a)

Now, the insertion processing to inset the level-converting cell (steps S21 to S24) will be described with reference to a specific example. FIGS. 6(a) to 6(c) show an example of the net list 20, the power supply information 22 and the level-converting cell information 26 of FIG. 5, respectively. FIG. 7 shows a layout object circuit corresponding to the net list 20 of FIG. 6(a). The net list 20 of FIG. 6(a) is the same as the net list 10 of FIG. 3(a) except that the signal terminal A1 of the cell C1 (instance name: I1) is designated for connection to a net N0.

The power supply information 22 of FIG. 6(b) is the same as the power supply information 12 of FIG. 3(b) except that the power supply voltage VDDA (3.3 V) is designated for supply to the power supply terminal VDD of the cell C2 (instance name: I2). The level-converting cell information 26 of FIG. 6(c) shows that a level-converting cell LVC1 is a level-down cell that converts a 3.3 V-system signal (high level: 3.3 V, low level: 0 V) to a 1.8 V-system signal (high level: 1.8 V, low level: 0 V), and that a level-converting cell LVC2 is a level-up cell that converts a 1.8 V-system signal to a 3.3 V-system signal.

FIG. 8 shows an example of the terminal group information 24 of FIG. 5. The terminal group information 24 is generated by adding information related to the level-converting cells LVC1, LVC2 to the terminal group information 14 of FIG. 3(c). An input signal terminal A and power supply terminals VDD1, VSS of the level-converting cell LVC1 (LVC2) belong to the same group. This means that a circuit that receives a signal from a signal terminal A within the level-converting cell LVC1 (LVC2) is connected to power supply terminals VDD1, VSS. An output signal terminal X and power supply terminal VDD2, VSS of the level-converting cell LVC1 (LVC2) belong to the same group. This means that a circuit that outputs a signal to a signal terminal X within the level-converting cell LVC1 (LVC2) is connected to power supply terminals VDD2, VSS.

In the layout processing using the net list 20, the power supply information 22, the terminal group information 24 and the level-converting cell information 26 as described above, first, for example, the power supply terminals VDD2, VSS belonging to the same group as the signal terminal X2 of the cell C1 (instance name: I1) and the power supply terminals VDD, VSS belonging to the same group as the signal terminal A of the cell C2 (instance name: I2) in the net N3 are specified on the basis of the terminal group information 24 (step S21 of FIG. 5). Next, the power supply voltage VDDB (1.8 V) corresponding to the power supply terminal VDD 2 of the cell C1 and the power supply voltage VDDA (3.3 V) corresponding to the power supply terminal VDD of the cell C2 are specified on the basis of the power supply information 22 (step S22 of FIG. 5). Next, since the specified power supply voltages are different from each other, the level-converting cell LVC2 that converts a 1.8 V-system signal to a 3.3 V-system signal is selected on the basis of the level-converting cell information 26 (step S23 of FIG. 5). Then, the net list 28 is generated in which the level-converting cell LVC2 is inserted between the signal terminal X2 of the cell C1 (instance name: I1) and the signal terminal A of the cell C2 (instance name: I2) (step S24 of FIG. 5).

Figure 10:
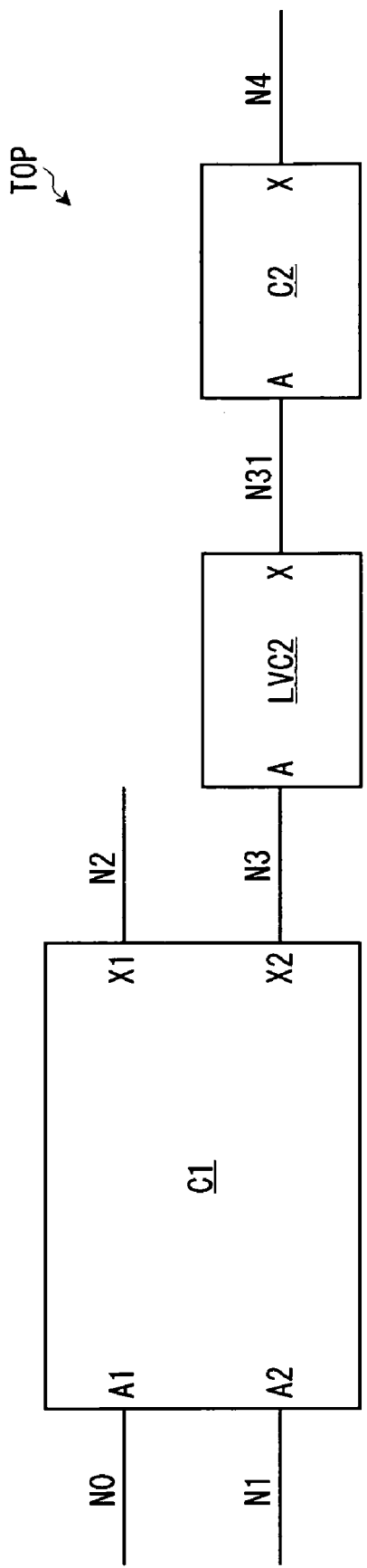
FIG. 10 is an explanatory view showing a layout object circuit corresponding to the net list of FIG. 9.

FIG. 9 shows an example of the net list 28 generated by inserting the level-converting cell LVC2 into the net list 20 of FIG. 6(a). FIG. 10 shows a layout object circuit corresponding to the net list 28 of FIG. 9. In FIGS. 9 and 10, the layout object circuit TOP includes the level-converting cell LVC2 (instance name: I3). In the net list 28 of FIG. 9, the input signal terminal A of the level-converting cell LVC2 (instance name: I3) is designated for connection to the net N3. That is, the signal terminal X2 of the cell C1 (instance name: I1) and the signal terminal A of the level-converting cell LVC2 (instance name: I3) are designated for interconnection. Also, the output signal terminal X of the level-converting cell LVC2 (instance name: I3) is designated for connection to a net N31. The input signal terminal A of the cell C2 (instance name: I2) is designated for connection to the net N31 instead of the net N3. That is, the signal terminal X of the level-converting cell LVC2 (instance name: I3) and the signal terminal A of the cell C2 (instance name: I2) are designated for interconnection. In this manner, the level-converting cell LVC2 of the type that should be inserted is automatically inserted between the signal terminal X2 of the cell C1 (instance name: I1) and the signal terminal A of the cell C2 (instance name: I2) where the level-converting cell should be inserted. Then, the layout processing for the layout object circuit TOP is carried out, using the net list 28 and the power supply information 22.

As described above, in the second embodiment, since the level-converting cell of the type that should be inserted can be inserted at the position where it should be inserted on the basis of automatic judgment without any manual operation, no incorrect connection due to the level-converting cell is detected in layout verification such as LVS. Therefore, the number of repetitions of the layout processing and the layout verification can be reduced and this can contribute to reduction in layout design period for the semiconductor integrated circuit.

In the first embodiment, the present invention is applied to the layout processing for the semiconductor integrated circuit driven by the high-potential power supply voltages VDDA (3.3 V), VDDB (1.8 V) of two systems and different potentials and the low-potential power supply voltage VSS (0 V) of one system. However, the present invention is not limited to this embodiment. For example, the present invention may also be applied to layout processing for a semiconductor integrated circuit driven by high-potential power supply voltages VDDA, VDDB (both at 3.3 V) of two systems and the same potential and a low-potential power supply voltage VSS (0 V) of one system, or a semiconductor integrated circuit driven by a high-potential power supply voltage VDD (3.3 V) of one system and low-potential power supply voltages VSSA, VSSB (both at 0 V) of two systems.

The invention is not limited to the above embodiments and various modifications may be made without departing from the spirit and scope of the invention. Any improvement may be made in part or all of the components.

What is claimed is:

1. A method to layout a semiconductor integrated circuit driven by plural power supply voltages, the method comprising:
    specifying a power supply terminal corresponding to a signal terminal designated for the input level fixation by circuit connectivity information representing connecting relations between circuit components in a layout object circuit, the specifying done on a basis of terminal correspondence information representing, for each circuit component, a corresponding relation between a signal terminal and a power supply terminal which is connected to one of a receiving circuit that receives a signal from the signal terminal and an output circuit that outputs a signal to the signal terminal within the circuit component;
    specifying a power supply voltage corresponding to the specified power supply terminal on a basis of power supply information representing a corresponding relation between a power supply voltage and a power supply terminal; and
    routing a power supply line of the specified power supply voltage to the signal terminal designated for the input level fixation and connecting the power supply line and the signal terminal.

2. The method to layout a semiconductor integrated circuit as claimed in claim 1, wherein the terminal correspondence information is structured by grouping, for each circuit component, signal terminals and power supply terminals that are connected to one of the receiving circuit that receives a signal from the signal terminal and the output circuit that outputs the signal to the signal terminal within the circuit component as a group.

3. The method to layout a semiconductor integrated circuit as claimed in claim 1, wherein the power supply information associates power supply voltage name, power supply voltage value, and a power supply terminal to be supplied with the power supply voltage.

4. A computer readable storage storing a program readable by a computer for controlling the computer to layout a semiconductor integrated circuit to be driven by plural power supply voltages by:

specifying a power supply terminal corresponding to a signal terminal designated for an input level fixation by circuit connectivity information representing connecting relations between circuit components in a layout object circuit, the specifying done on a basis of terminal correspondence information representing, for each circuit component, a corresponding relation between a signal terminal and a power supply terminal which is connected to one of a receiving circuit that receives a signal from the signal terminal and an output circuit that outputs a signal to the signal terminal within the circuit component;

specifying a power supply voltage corresponding to the specified power supply terminal on a basis of power supply information representing a corresponding relation between a power supply voltage and a power supply terminal; and routing a power supply line of the specified power supply voltage to the signal terminal designated for the input level fixation and connecting the power supply line and the signal terminal.

5. The computer readable storage storing a program as claimed in claim 4, wherein the terminal correspondence information is structured by grouping, for each circuit component, signal terminals and power supply terminals that are connected to one of the receiving circuit that receives a signal from the signal terminal and the output circuit that outputs a signal to the signal terminal within the circuit component as a group.

6. The computer readable storage storing a program as claimed in claim 4, wherein the power supply information associates power supply voltage name, power supply voltage value, and a power supply terminal to be supplied with the power supply voltage.

7. A system to layout a semiconductor integrated circuit driven by plural power supply voltages, the system comprising:

a storage unit storing a program to carry out specifying a power supply terminal corresponding to a signal terminal designated for the input level fixation by circuit connectivity information representing connecting relations between circuit components in a layout object circuit, the specifying done on a basis of terminal correspondence information representing, for each circuit component, a corresponding relation between a signal terminal and a power supply terminal which is connected to one of a circuit that receives a signal from the signal terminal and a circuit that outputs a signal to the signal terminal within the circuit component, specifying a power supply voltage corresponding to the specified power supply terminal on a basis of power supply information representing a corresponding relation between a power supply voltage and a power supply terminal, to the signal terminal designated for the input level fixation and connecting the power supply line and the signal terminal; and a control unit reading and executing the program stored in the storage unit to perform the specifying and layout of the semiconductor integrated circuit.

8. The system to layout a semiconductor integrated circuit as claimed in claim 7, wherein the terminal correspondence information is structured by grouping, for each circuit component, signal terminals and power supply terminals that are connected to one of the circuit that receives a signal from the signal terminal and the circuit that outputs a signal to the signal terminal within the circuit component as a group.

9. The system to layout a semiconductor integrated circuit as claimed in claim 7, wherein the power supply information associates power supply voltage name, power supply voltage value, and a power supply terminal to be supplied with the power supply voltage.

* * * * *